United States Patent [19]

Yoo et al.

[11] Patent Number: 5,446,697

[45] Date of Patent: Aug. 29, 1995

[54] SEMICONDUCTOR MEMORY DEVICE

[75] Inventors: Seung-Moon Yoo, Suwon; Ejaz ul Haq, Seoul; Yun-Ho Choi, Suwon; Soo-In Cho; Dae-Je Chin, both of Seoul; Nam-Soo Kang; Seung-Hun Lee, both of Suwon, all of Rep. of Korea

[73] Assignee: Samsung Electronics Co., Ltd., Suwon, Rep. of Korea

[21] Appl. No.: 68,547

[22] Filed: May 28, 1993

[30] Foreign Application Priority Data

Dec. 2, 1992 [KR] Rep. of Korea ............... 23132/1992

[51] Int. Cl.⁶ ............................................ G11C 13/00
[52] U.S. Cl. .................. 365/226; 365/189.07; 365/189.09
[58] Field of Search ............... 365/226, 189.09, 189.07

[56] References Cited

U.S. PATENT DOCUMENTS

| | | | |
|---|---|---|---|
| 5,258,950 | 11/1993 | Murashima et al. | 365/226 X |
| 5,267,201 | 11/1993 | Foss et al. | 365/226 X |
| 5,278,792 | 1/1994 | Inoue et al. | 365/226 X |
| 5,329,168 | 7/1994 | Sugibayashi et al. | 365/226 X |

*Primary Examiner*—Do Hyun Yoo
*Attorney, Agent, or Firm*—Robert A. Westerlund; Stephen R. Whitt; Charles R. Donohoe

[57] ABSTRACT

A semiconductor memory device stably operates over a wide range of the power supply voltage by including a power supply voltage level detector for generating detecting signals according to predetermined levels of the power supply voltage and an oscillator for generating a frequency-controlled oscillation pulse whose frequency is changeable according to the detecting signals. Thus, a boosting ratio of a boosting circuit, the refresh period of a refresh circuit and the substrate voltage of a substrate voltage generator can be adaptively changeable according to the variation of the power supply voltage.

21 Claims, 5 Drawing Sheets

SEMICONDUCTOR MEMORY DEVICE

BACKGROUND OF THE INVENTION

The present invention relates to a semiconductor memory device, and more particularly to a semiconductor memory device stably operating over a wide range of the power supply voltage.

Currently, operating voltages of semiconductor memory devices are being diversified and lowered. Using a low power supply voltage is generally advantageous in decreasing the power consumption, especially in a semiconductor memory device which employs a battery as a power supply. However, the low power supply voltage causes various problems. For example, the low power supply voltage may not be high enough to drive word lines. This is because, in order to fully turn on a cell transistor, the voltage for driving the word lines must be higher than the voltage for driving the bit lines. Taken a DRAM cell as an example; when data "1" in the low power supply voltage level is stored in a storage capacitor via a bit line pair by turning on a cell transistor, it is preferable to boost the potential level of the data "1" up to the power supply voltage plus the threshold voltage of the cell transistor, prior to storing the data. To this end, a boost voltage is employed, which is obtained by boosting the power supply voltage up to a predetermined level, using a boosting circuit. Generally, a boosting ratio indicative of how many times the power supply voltage is boosted up from the power supply voltage, is fixed. Consequently, the boost voltage resulting from a overly-low power supply voltage is still too low to overcome the threshold voltage, thereby causing a malfunction during writing in and/or reading out the data. Contrarily, the boost voltage resulting from a overly-high power supply voltage becomes excessively high to thus destroy a gate layer of the cell transistor, thereby causing an inevitable damage to the memory device.

A technique is suggested for solving the foregoing problems in Symposium on VLSI Circuits, 1990, by Nakagome et al. in an article entitled: "A 1.5V Circuit Technology for 64 Mb DRAMs". The article discloses that if a power supply voltage in a range of 1.5V–3.3V is applied to the semiconductor memory device, the power supply voltage is converted into 1.5V to drive the memory device. Accordingly, the memory device can be operated by the power supply voltage of a wide voltage range, e.g., 1.5V–3.3V. In addition, since the power supply voltage is lowered to a voltage of 1.5V in the memory device to be used as an operating voltage, the power consumption is reduced. In this technique, to drive the word lines, the voltage of 1.5V is boosted up to a predetermined level by a boosting circuit (refer to 1990 Symposium on VLSI Circuits Digest of Technical Papers, pp. 17–18, for more detailed technical information).

However, since the relatively low voltage of 1.5V is used in the above described conventional technique, the boosting ratio should be high enough to obtain a sufficiently boosted voltage for driving the word lines. Consequently, the boosting circuit should operate very frequently to boost up the power supply voltage, which causes an increase of the power consumption.

Furthermore, since a sufficiently high power supply voltage is forcibly dropped down to be used as an operating voltage of 1.5V, the power is unnecessarily consumed. Also, with using pump capacitors, to boost up the voltage which has been forcibly dropped down to 1.5V is very inefficient, and brings on a power loss caused by operations of the boosting circuit.

SUMMARY OF THE INVENTION

Therefore, it is an object of the present invention to provide a semiconductor memory device stably operating over a wide range of a power supply voltage, without causing a power loss.

It is another object of the present invention to provide a semiconductor memory device for controlling a boosting ratio in dependance upon the level of a power supply voltage, thereby stably operating without causing a power loss.

It is further another object of the present invention to provide a semiconductor memory device having an oscillator generating an oscillation pulse, the period thereof being varied in dependance upon the level of a power supply voltage.

It is yet another object of the present invention to provide a semiconductor memory device, wherein the capacitances of pump capacitors in a pumping circuit are varied in dependance upon the level of a power supply voltage, thereby generating an adaptive boost voltage.

It is still another object of the present invention to provide a semiconductor memory device generating a stable substrate voltage in dependance upon the level of a power supply voltage.

It is still another object of the present invention to provide a semiconductor memory device stably performing a refresh operation by adjusting a refresh period in dependance upon the level of a power supply voltage.

According to a first aspect of the present invention, a semiconductor memory device includes a power supply voltage level detecting circuit for detecting predetermined levels of a power supply voltage to generate detecting signals each corresponding to the levels of the power supply voltage.

According to a second aspect of the present invention, a semiconductor memory device includes a power supply voltage level detecting circuit for detecting predetermined levels of a power supply voltage to generate detecting signals each corresponding to the levels, and an oscillating circuit for generating a frequency-controlled oscillation pulse whose frequency is changeable according to the detecting signals.

According to a third aspect of the present invention, a semiconductor memory device having a boosting circuit includes a power supply voltage level detecting circuit for detecting predetermined levels of a power supply voltage to generate detecting signals each corresponding to the levels, an oscillating circuit for generating a frequency-controlled oscillation pulse whose frequency is changeable according to the detecting signals, and a pumping circuit for pumping up the power supply voltage to generate a boost voltage to a predetermined level by operating pump capacitors in response to the pumping signal, wherein a boosting ratio being changeable according to the levels of power supply voltage.

According to a fourth aspect of the present invention, a semiconductor memory device having a boosting circuit includes a power supply voltage level detecting circuit for detecting predetermined levels of a power supply voltage to generate detecting signals each corresponding to the levels, a reference oscillating circuit for generating a reference oscillation pulse, a pumping driver for generating a pumping signal in response to the reference oscillation pulse, a pumping circuit for selectively allowing a plurality of pump capacitors to operate in response to the pumping signal, so as to generate a boost voltage, and a pumping capacitance controlling circuit for controlling operation of the pump capacitors according to the detecting signals, thereby adjusting a boosting ratio according to the level of the power supply voltage.

According to a fifth aspect of the present invention, a semiconductor memory device having a boosting circuit includes a power supply voltage level detecting circuit for detecting predetermined levels of a power supply voltage to generate detecting signals each corresponding to the levels, an oscillating circuit for generating a frequency-controlled oscillation pulse in dependence upon the detecting signals, a pumping driver for generating a pumping signal in response to the frequency-controlled oscillation pulse, a pumping circuit for selectively allowing a plurality of pump capacitors to operate in response to the pumping signal, so as to generate a boost voltage, a pumping capacitance controlling circuit for controlling operation of the pump capacitors according to the detecting signals, thereby adjusting a boosting ratio according to the level of the power supply voltage, and a boost voltage detecting circuit for detecting the level of the boost voltage to generate a boost-level detecting signal, and for controlling an oscillating operation of the oscillating circuit in response to the boost-level detecting signal, whereby oscillating frequency of the oscillating circuit and the pumping capacitance of the pumping circuit are changeable according to the power supply voltage.

According to a sixth aspect of the present invention, a semiconductor memory device having a substrate voltage generating circuit includes a power supply voltage level detecting circuit for detecting predetermined levels of a power supply voltage to generate detecting signals each corresponding to the levels, an oscillating circuit for generating a frequency-controlled oscillation pulse in dependence upon the detecting signals, a pumping driver for generating a pumping signal in response to the frequency-controlled oscillation pulse, a pumping circuit for generating selectively allowing a plurality of pump capacitors to operate in response to the pumping signal, so as to generate a substrate voltage, and a substrate voltage detecting circuit for detecting the level of the substrate voltage to generate a substrate voltage level detecting signal, and for controlling an oscillating operation of the oscillating circuit in response to the substrate voltage level detecting signal, whereby oscillating frequency of the oscillating circuit and the pumping capacitance of the pumping circuit are changeable according to the power supply voltage.

According to a seventh aspect of the present invention, a semiconductor memory device having a substrate voltage generating circuit includes a power supply voltage level detecting circuit for detecting predetermined levels of a power supply voltage to generate detecting signals each corresponding to the levels, a reference oscillating circuit for generating a reference oscillation pulse, a pumping driver for generating a pumping signal in response to the reference oscillation pulse, a pumping circuit for selectively allowing a plurality of pump capacitors to operate in response to the pumping signal, so as to generate a substrate voltage, a pumping capacitance controlling circuit for controlling operation of the pump capacitors according to the detecting signals, thereby adjusting a boosting ratio according to the level of the power supply voltage, and a substrate voltage detecting circuit for detecting the level of the substrate voltage to generate a substrate voltage level detecting signal, and for controlling an oscillating operation of the reference oscillating circuit in response to the substrate voltage level detecting signal, whereby oscillating frequency of the reference oscillating circuit and the pumping capacitance of the pumping circuit are changeable according to the power supply voltage.

According to an eighth aspect of the present invention, a semiconductor memory device having a substrate voltage generating circuit includes a power supply voltage level detecting circuit for detecting predetermined levels of a power supply voltage to generate detecting signals each corresponding to the levels, an oscillating circuit for generating a frequency-controlled oscillation pulse in dependence upon the detecting signals, a pumping driver for generating a pumping signal in response to the frequency-controlled oscillation pulse, a pumping circuit for selectively allowing a plurality of pump capacitors to operate in response to the pumping signal, so as to generate a substrate voltage, and a pumping capacitance controlling circuit for controlling operation of the pump capacitors according to the detecting signals, thereby adjusting a boosting ratio according to the level of the power supply voltage, and a substrate voltage detecting circuit for detecting the level of the substrate voltage to generate a substrate voltage level detecting signal, and for controlling an oscillating operation of the reference oscillating circuit in response to the substrate voltage. level detecting signal, whereby oscillating frequency of the reference oscillating circuit and the pumping capacitance of the pumping circuit are changeable according to the power supply voltage.

According to a ninth aspect of the present invention, a semiconductor memory device includes a power supply voltage level detecting circuit for detecting predetermined levels of a power supply voltage to generate detecting signals each corresponding to the levels, a oscillating circuit for generating a frequency-controlled oscillation pulse in dependence upon the detecting signals, a refresh control circuit for adjusting a refresh period according to the frequency-controlled oscillating signal of the oscillating circuit, whereby the refresh period is varied according to a variation of the power supply voltage.

BRIEF DESCRIPTION OF THE DRAWINGS

The above objects and other advantages of the present invention will become more apparent by describing in detail a preferred embodiment thereof with reference to the attached drawings in which.

DETAILED DESCRIPTION OF THE PREFERRED EMBODIMENTS

Hereinbelow, more details will be given while focusing on elements susceptible to the level of a power supply voltage, and constructions and operations of the known circuits will be, however, omitted.

Figure 1:
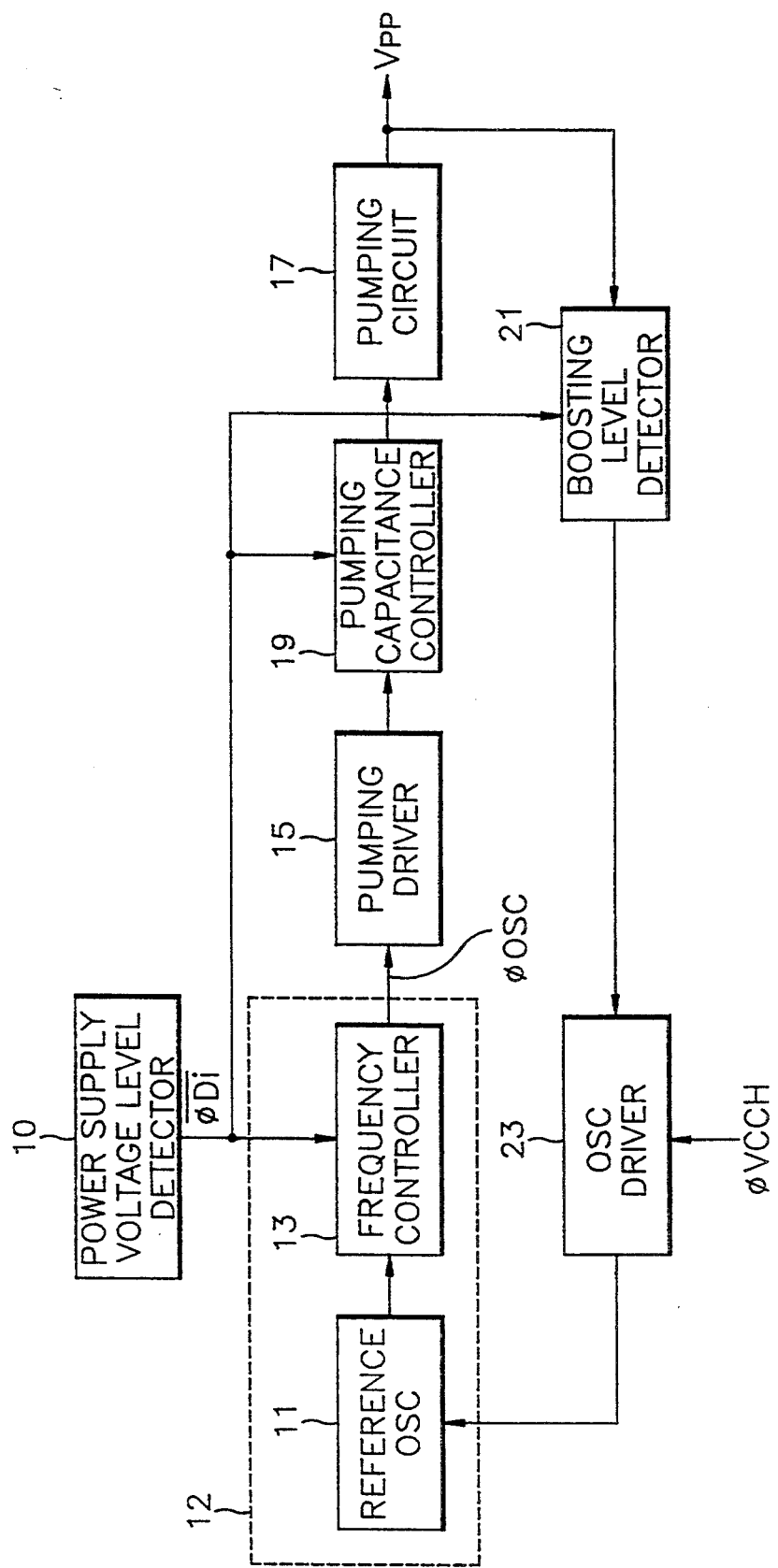
FIG. 1 is a schematic block diagram showing a boosting circuit according to the present invention.

Referring to FIG. 1, a boosting circuit according to the present invention includes a reference oscillator 11 for generating a reference oscillation pulse having a predetermined frequency in response to an oscillator driving signal; a power supply voltage level detector 10 for generating different detecting signals/$\phi$Di (inverse $\phi$Di) each corresponding to the levels (e.g., 2V, 2.5V and 3V) of the power supply voltage; a frequency controller 13 for varying the frequency of the reference oscillation pulse output from the reference oscillator 11 in response to the detecting signals/$\phi$Di from the power supply level detector 10; a pumping driver 15 for generating a pumping signal in response to the reference oscillation pulse output varied by the frequency controller 13; a pumping circuit 17 for generating a boost voltage Vpp by means of pump capacitors which perform a charge pumping operation in response to the pumping signal; a pumping capacitance controller 19 for generating pumping capacitance control signals to control the pumping capacitance of the pumping circuit 17 in response to the pumping capacitance control signal corresponding to the detecting signals from the power supply level detector 10; a boost voltage detector 21 for detecting the level of the boost voltage output from the pumping circuit 17 in response to the detecting signal from the power supply voltage level detector 10, to generate boost-level detecting signals; and an oscillator driver 23 for generating the oscillator driving signal to control the reference oscillator 11 in response to the boost-level detecting signals.

Figure 2:
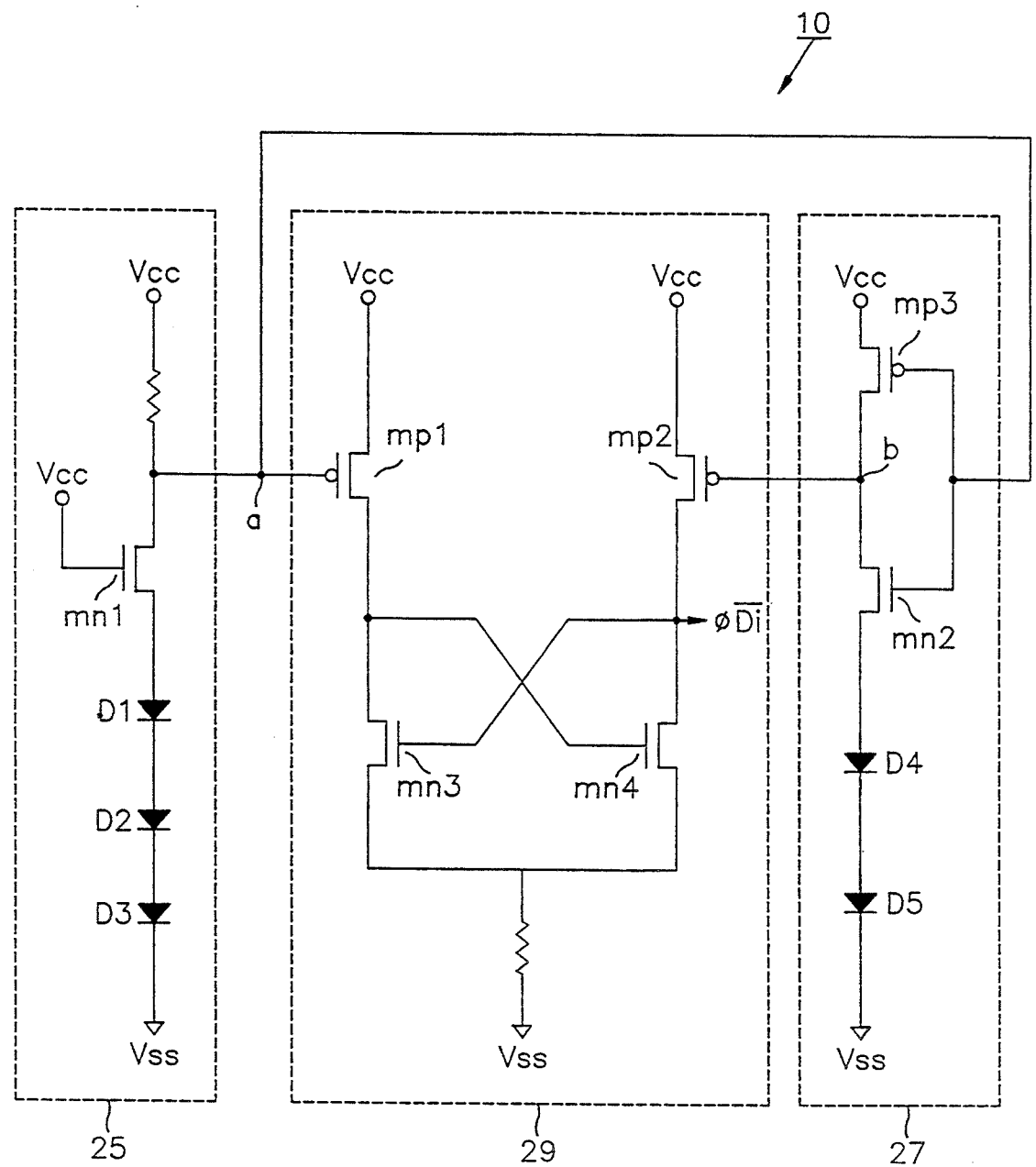
FIG. 2 is a detailed circuit diagram of the power supply voltage level detector shown in FIG. 1.

The reference oscillator 11 can be implemented by a ring oscillator and generates the reference oscillation pulse having a predetermined period, in which the reference oscillator 11 operates to generate the reference oscillation pulse upon receipt of the oscillator driving signal. The power supply voltage level detector 10 includes a number of voltage level detectors of FIG. 2, each having different voltage detecting level, so as to detect the levels of the power supply voltage and generate the detecting signals/$\phi$Di according to the levels of the power supply voltage. For example, if the power supply voltage exceeds a specific level (e.g., 2V), a detecting signal corresponding to this level is generated; however, if the power supply voltage level reaches the higher level (e.g., 2.5V) a different detecting signal corresponding thereto is generated. The number of detecting signals is set to be the same as the number of levels desired to detect. Further, it should be noted that if the power supply voltage of a specific level is applied to the boosting circuit, all the detecting signals corresponding to the specific level and below that level are generated from the corresponding voltage level detectors in the power supply voltage level detector 10. Upon the user's choice, the power supply voltage level detector 10 may be modified to generate all the detecting signals corresponding to the specific level and over that level. For example, when the power supply voltage of 3V which becomes the specific level is supplied under the state that the respective voltage level detectors included in the power supply voltage level detector 10 are respectively designed to detect the levels of 2.5V, 3.0V and 3.5V, the power supply voltage level detector 10 generates the respective detecting signals corresponding to the levels of 2.5V and 3V which are below the specific level of 3V.

Figure 3:
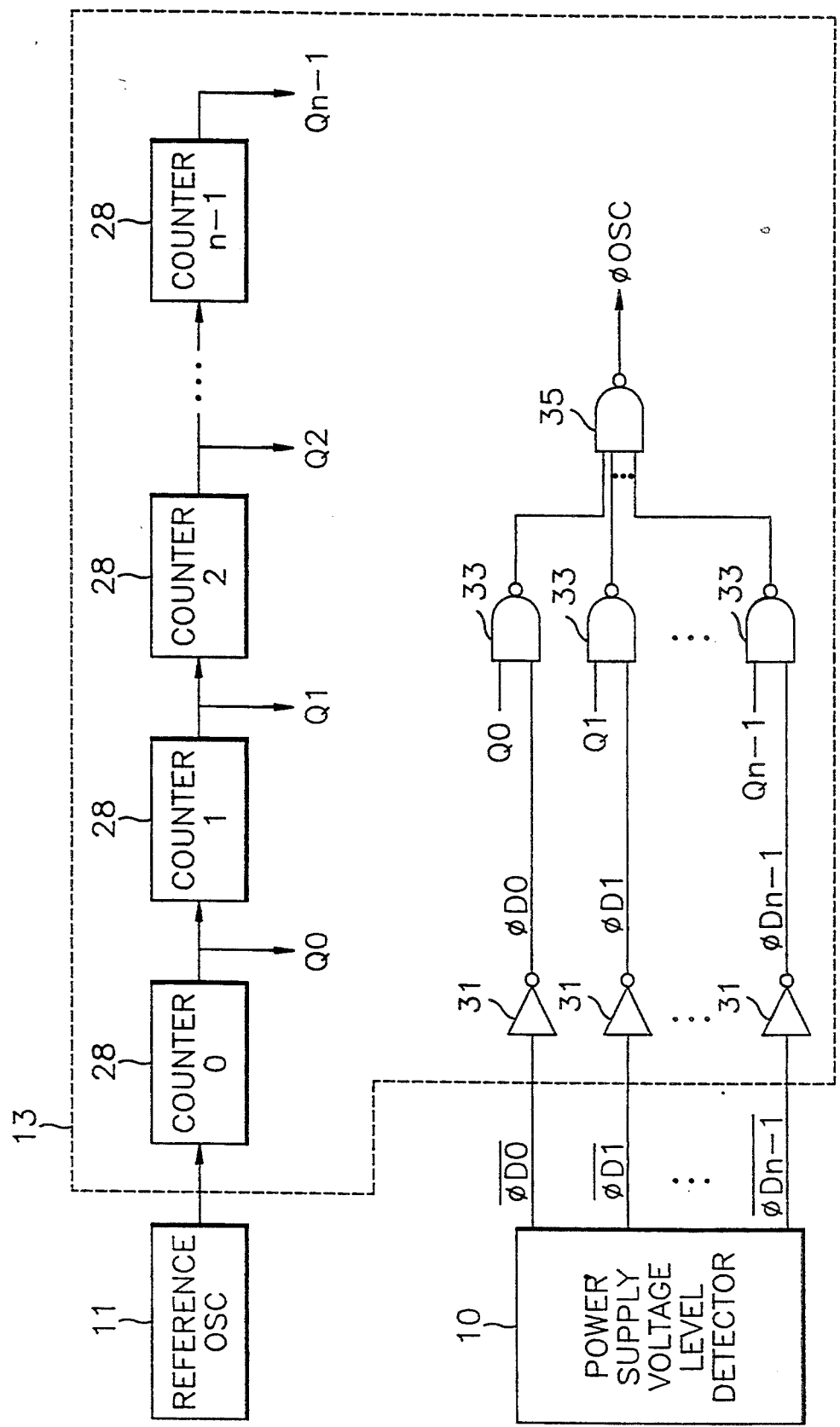
FIG. 3 is a detailed circuit diagram of the frequency controller shown in FIG. 1.
Figure 4:
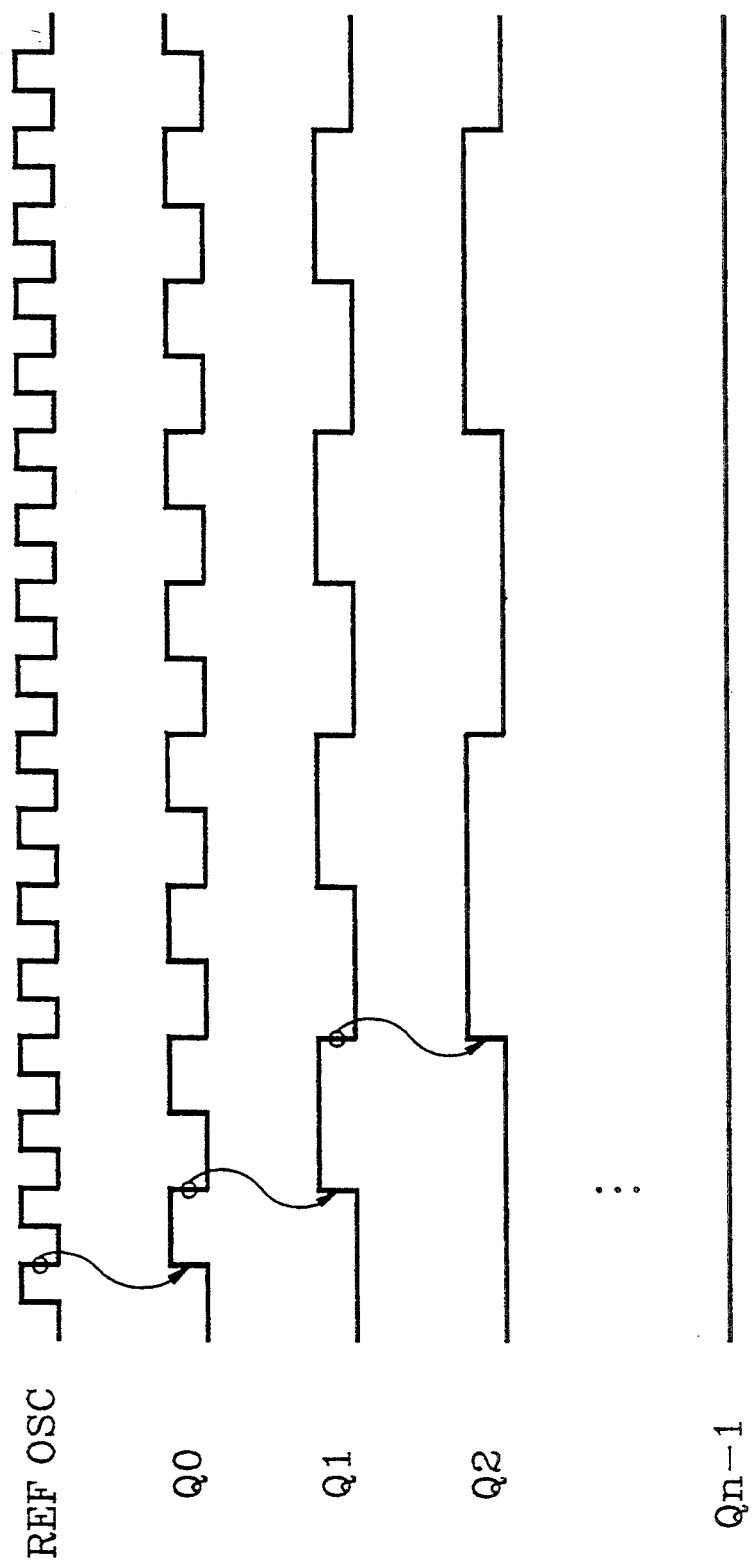
FIG. 4 is a timing chart of pulses generated from the multistage counter shown in FIG. 3.

As shown in FIG. 3, the frequency controller 13 is comprised of a multistage counter consisting of a number of serially-connected counters 28 receiving the reference oscillation pulse generated from the reference oscillator 11 to generate various frequency-divided pulse trains of FIG. 4. Further, the frequency controller 13 includes a logic combination circuit (31, 33, 35) for generating a frequency-controlled oscillation pulse $\phi$OSC by logically combining the frequency-divided pulse outputs from the multistage counter with the detecting signals. Each of the counters 28 receives the pulse output from its preceding stage and frequency-divides the received pulse by two, to thereby supply a frequency-divided pulse train to its succeeding stage. The number of the counters 28 is the same as the number of the levels of the power supply voltage to detect. And, the detecting signal/$\phi$D0 corresponding to the lowest level to detect is logically combined with the frequency-divided pulse output Q0 of the highest frequency. On the contrary, the detecting signal /$\phi$Dn-1 corresponding to the highest level of the power supply voltage to detect is logically combined with the frequency-divided pulse output Qn-1 of the lowest frequency. Then, the respective logic combination signals are combined by a NAND gate 35, thereby obtaining the frequency-controlled oscillation pulse $\phi$OSC whose period is varied in response to the level of the power supply voltage. That is, if the lower power supply voltage is applied, the frequency-controlled oscillation pulse $\phi$OSC having the higher frequency is generated. Therefore, the reference oscillator 11 and frequency controller 13 serve as a single oscillator 12 generating the frequency-controlled oscillation pulse which frequency is variable according to the level of the power supply voltage.

The pumping driver 15 reshapes the frequency-controlled oscillation pulse from the frequency controller 13 to generates the pumping signal for driving the pump capacitors in the pumping circuit 17. The pumping circuit 17 has a plurality of pump capacitors for pumping charges therein according to the pumping signal. The pump capacitors pump up the charges therein according to the pumping signal to boost up the power supply voltage by multiple times and to thereby generate the boost voltage Vpp of a predetermined level at the output terminals thereof.

The pumping capacitance controller 19 receives the pumping signal and controls the pumping signal paths through which the pumping signal is selectively delivered to the pump capacitors in the pumping circuit 17, in response to the detecting signals/$\phi$Di. It should be noted that the pump capacitors have the difference capacitances from each other. Accordingly, if the power supply voltage becomes lower, a pump capacitor having the higher capacitance operates to pump up the power supply voltage by a great extent; whereas, if the power supply voltage becomes higher, a pump capacitor having the lower capacitance operates to pump up the power supply voltage by a small extent. That is, the boosting ratio is controllable according to the level of the power supply voltage. For instance, if a higher power supply voltage of 3V is applied, it is boosted up to 4.5V (1.5 times higher than the power supply voltage); whereas, if a lower power supply voltage of 1.5V is applied, it is boosted up to 4V (twice higher than the supply voltage). In accordance with another embodiment of the present invention, all the pump capacitors may be designed to have the same capacitance. In this case, however, the number of the pump capacitors operating at a time to pump up the power supply voltage should be controllable according to the level of the power supply voltage. Accordingly, since the inventive boosting circuit controls the boosting ratio of the power supply voltage to the boost voltage according to the level of the power supply voltage, a soft error (data writing error) which may occur in a overly-low power supply voltage can be prevented.

The boost voltage detector 21 senses the levels of the boost voltage from the pumping circuit 17, to generate boost-level detecting signals which are to be applied to the reference oscillator 11 by way of the oscillator driver 23, so as to disable an operation of the reference oscillator 11 when the boost voltage reaches a predetermined level. It should be noted that, according to the present invention, the boost level of the pumping circuit 17 detected by the boost voltage detector 21 varies according to the level of the power supply voltage. In other words, when a lower power supply voltage is applied, the boost voltage detector 21 detects a level of the boost voltage Vpp corresponding to a higher boosting ratio, to generate the boost-level detecting signal. On the contrary, if a higher power supply voltage is applied, the boost voltage detector 21 detects a level of the boost voltage Vpp corresponding to a lower boosting ratio, to generate the boost-level detecting signal. For example, when the lower power supply voltage of 2V is applied, the boost voltage detector 21 detects a boost voltage of 4V (i.e., twice the power supply voltage); however, when the higher power supply voltage of 3V is applied, the boost voltage detector 21 detects a boost voltage of 4.5V (i.e., 1.5 times the power supply voltage). In order to carry out the above mentioned operation, the boost voltage detector 21 includes a number of voltage level detectors which may be similar to the circuit of FIG. 2, each of the voltage level detectors detecting different level of the power supply voltage.

The oscillator driver 23 generates the oscillator driving signal which enables the reference oscillator 11 to generate the reference oscillation pulse in accordance with the boost-level detecting signal output of the boost voltage detector 21. In an initial state, the oscillator driving signal is generated in response to a signal φVCCH indicative of a power-up state of the boosting circuit. In the meantime, if the boost voltage detector 21 generates the boost-level detecting signal upon detecting a predetermined level of the boost voltage Vpp, the oscillator driver 23 disables the reference oscillator 11 to stop the generation of the reference oscillation pulse.

In summary, if the level of the power supply voltage is sensed by the power supply voltage level detector 10, the level of the boost voltage to be generated from the pumping circuit 17 is established. Then, the pumping circuit 17 performs the charge pumping operation according to the signal outputs of the oscillator 12, pumping driver 15 and pumping capacitance controller 19, so as to boost the power supply voltage up to the established level of the boost voltage. Once the output of the pumping circuit 17 reaches the established level, the operation of the reference oscillator 11 is stopped by the operations of the boost voltage detector 21 and oscillator driver 23. Such operations repeatedly continues.

According to another embodiment of the present invention, the pumping capacitance controller 19 can be excluded from the boosting circuit of FIG. 1. In this case, the boosting circuit boosts the power supply voltage according to frequency-controlled oscillation pulse and the pumping signal, and the level of the boost voltage Vpp from the pump capacitors in the pumping circuit 17 is determined in proportional to the frequency of the pumping signal. According to yet another embodiment, the frequency controller 13 and the pumping driver 15 may be excluded from the boosting circuit of FIG. 1. In this case, the pumping capacitance controller 19 generates the pumping capacitance control signal according to the detecting signals from the power supply voltage level detector 10.

It should be noted that these various modifications of the boosting circuit according to the present invention are achieved by using the power supply voltage level detector 10 which includes a number of voltage level detectors each detecting the different level of the power supply voltage.

In the boosting circuit according to the present invention, the boosting factor (i.e., boosting ratio) is determined depending on the level of the power supply voltage. As a result, the power loss is reduced, unlike the conventional apparatus. Moreover, the present invention can solve the problems of the conventional apparatus that when the lower power supply voltage is applied, the boost voltage becomes too low to overcome the turn-on voltage (threshold voltage) of the cell transistor because the boosting factor is constant regardless of the level of the power supply voltage.

Referring back to FIG. 2, the voltage level detector included in the power supply voltage level detector 10, includes a reference voltage generator 25 for generating a reference voltage, a comparative voltage generator 27 for generating a comparative voltage, and a comparator for comparing the reference voltage with the comparative voltage.

In operation, when the power supply voltage Vcc supplied to a node "a" which is an output node of the reference voltage generator 25 has a lower level which cannot turn on n-channel transistor mn2 and diodes D4 and D5 of the comparative voltage generator 27, a p-channel transistor mp1 is turned-on while a p-channel transistors mp2 is turned-off. Thus, the detecting voltage /φDi is maintained at an initial state of "low". In the meantime, if the power supply voltage Vcc increases to a higher level which can turn on the n-channel transistor mn2 and diodes D4 and D5 of the comparative voltage generator 27, a node "b" which is an output node of the comparative voltage generator 27 goes to "low" the p-channel transistor mp2 is turned-on while the p-channel transistor mp1 is turned-off. As a result, the detecting signal/φDi goes to "high". Meanwhile, when the power supply voltage Vcc has a higher level which can turn on diodes D1, D2 and D3 of the reference voltage generator 25, the node "a" has a constant DC level which is the same as the sum of threshold voltages of an n-channel transistor mn1 and diodes D1-D3, so that a p-channel transistor mp1 having its gate connected to the node "a" is turned on, and consecutively turns on an n-channel transistor mn4 with the consequence of changing the detecting signal output/-φDi to "low". It can be therefore appreciated that by adjusting the current flowing through the diodes D1, D2 and D3 (e.g., by increasing/decreasing the number of serially-connected diodes), the power supply voltage level which the voltage level detector detects can be adjusted. Briefly, the power supply voltage level desired to detect can be easily obtained by increasing/decreasing the number of the serially-connected diodes in the reference voltage generator 25. If a p-channel transistor mp3 in the comparative voltage generator 27 is turned on by the higher voltage at the node "a" which can turn on the diodes D1, D2 and D3 of the reference voltage generator 25, the detecting signal output /$\phi$Di is latched to "low". Further, the operation speed for detecting the power supply voltage level can be enhanced by adjusting the relative sizes of the p-channel transistor mp3 and n-channel transistor mn2 of the comparative voltage generator 27. In more detail, if the size of the p-channel transistor mp3 becomes larger than sizes of the n-channel transistor mn2 and diodes D4 and D5, the turn-on operation of the p-channel transistor mp3 susceptibly responds to a slight difference of a source-gate voltage thereof. Accordingly, the detection operation depending on the power supply voltage can be speeded up. It should be understood that the voltage level detector shown in FIG. 2 has a single output signal/$\phi$Di, and the power supply voltage level detector 10 shown in FIG. 1 includes a plurality of the voltage level detectors of FIG. 2.

Referring to FIG. 3, the frequency controller 13 includes a number of counters 28 for receiving the reference oscillation pulse from the reference oscillator 11 to generate frequency-divided pulses; a number of inverters 31 for respectively receiving detecting signals /$\phi$D0-/$\phi$Dn-1 generated from the power supply voltage level detector 10 to respectively generate inverted detecting signals $\phi$D0-$\phi$Dn-1; a number of NAND gates 33 each receiving the respective output pulses Q0-Qn-1 from the counters 28 and the inverted detecting signals $\phi$D0-$\phi$Dn-1; and a NAND gate 35 for receiving the outputs of the NAND gates 33 to generate the frequency-controlled oscillation pulse $\phi$OSC.

FIG. 4 is timing charts showing the generation of the frequency-divided pulses Q0-Qn-1 obtained by frequency-dividing the reference oscillation pulses from the reference oscillator 11 through the operation of the counters 28 shown in FIG. 3.

Referring to FIGS. 3 and 4, operation of the frequency controller 13 will be explained. As the power supply voltage applied to the boosting circuit increases, the power supply voltage level detector 10 generates the detecting signals $\phi$Di in an order from the detecting signal /$\phi$D0 to the detecting signal/$\phi$Dn-1, and the counters 28 generate the frequency-divided pluses Q0-Qn-1 respectively having the different frequencies from the highest frequency to the lowest frequency. The detecting signals/$\phi$D0-/$\phi$Dn-1 and the frequency-divided pulses Q0-Qn-1are respectively applied in a pair to the respective NAND gates 33. The NAND gate 33 receiving at an input terminal the detecting signal /$\phi$D0 corresponding to the lowest power supply voltage level detected, receives at another input terminal the frequency-divided pulse Q0 having the highest frequency. On the contrary, the NAND gate 33 receiving at an input terminal the detecting signal /$\phi$Dn-1 receives at another input terminal the frequency-divided pulse Qn-1 having the lowest frequency. The frequency-controlled oscillation pulse $\phi$OSC is obtained by the NAND gate 35 logically combining the outputs of all the NAND gates 33. Thus, the frequency of the frequency-controlled oscillation pulse $\phi$OSC is variable according to the level of the power supply voltage (i.e., the operating period of the pulse is shortened as the power supply voltage becomes lowered).

Figure 5:
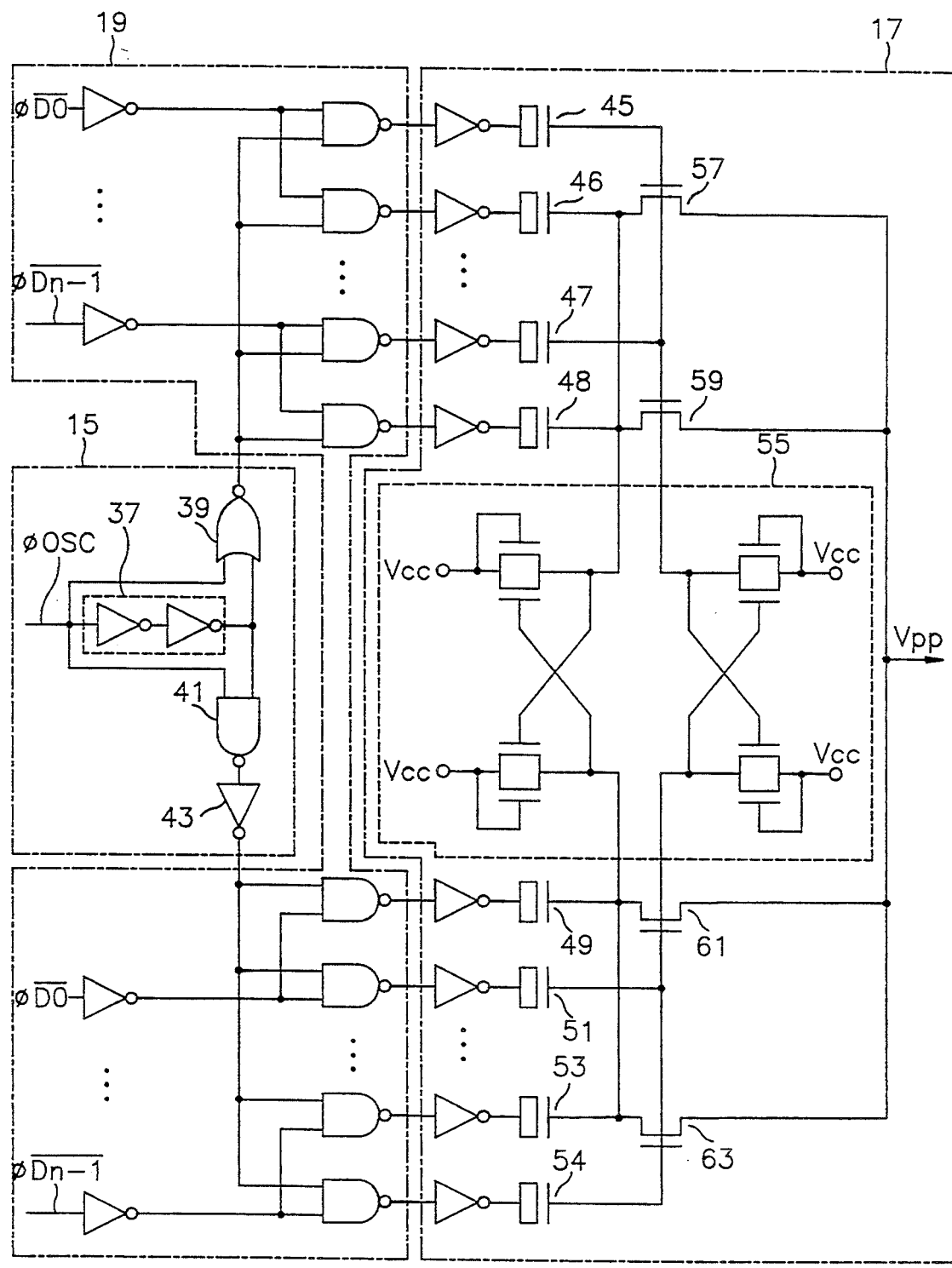
FIG. 5 is a detailed circuit diagram of the voltage pumping circuit shown in FIG. 1.

With reference to FIG. 5, operations of the pumping circuit 17, the pumping driver 15 and the pumping capacitance controller 19 will be described in detail. The pumping driver 15 generates the pumping signal in response to the frequency-controlled oscillation pulse $\phi$OSC from the frequency controller 13. The pumping driver 15 includes a NOR gate 39 and a NAND gate 41 both for receiving the frequency-controlled oscillation pulse $\phi$OSC at a first input terminal thereof and a delayed frequency-controlled oscillation pulse $\phi$OSC by a delay circuit 37 at the second input terminals respectively, and an inverter 43 for inverting an output of the NAND gate 41. The output signals of the NOR gate 39 and NAND gate 41 are non-synchronously generated, so that the respective output signals become first and second pumping signals for controlling the pumping operation. Thus, a first group of the pump capacitors (45–48) and a second group of the pump capacitors (49-54) in the pumping circuit 17 respectively responding to the first and second pumping signals perform the pumping operation nonsynchronously or complementarily.

The pumping capacitance controller 19 controls the pumping capacitance of the pumping circuit 17 by logically combining the first and second pumping signals with the detecting signals/$\phi$Di. According to the present invention, the capacitances of the respective pump capacitors are different from each other, and pump capacitors (45, 46) and (49, 51) corresponding to the detecting signal/$\phi$D0 having the lowest detecting level have the highest pumping capacitances, and pump capacitors (47, 48), (53, 54) corresponding to the detecting signal /$\phi$Dn-1 having the highest detecting level have the lowest pumping capacitances. The pump capacitors are supplied with a precharge voltage (charge voltage) which approximates to the power supply voltage Vcc from a precharge circuit 55. The pump capacitors 45, 47, 51 and 54 are connected to the respective gates of n-channel transistors 57, 59, 61 and 63 each serving as pass transistors. Upon turning on the pass transistors, the voltages output from the pump capacitors 46, 48, 49 and 53 are transferred to the output terminal Vpp. The pumping circuit 17 is well-known to an ordinary skilled in the art, and thus additional description will not be given. The level of the boost voltage Vpp is detected by the boost voltage detector 21, and the operation of the reference oscillator 11 is controlled according to the result of the detection of the boost voltage Vpp to thereby maintain the level of the boost voltage Vpp. In other words, when the boost voltage Vpp reaches a predetermined level, the reference oscillator is turned off to inhibit further pumping operation; whereas the pumping operation begins again to boost up the boost voltage when the boost voltage goes below the predetermined level.

Since one peculiar characteristic of the present invention is that the level of the boost voltage Vpp is determined in association with the power supply voltage Vcc, the boost voltage detector 21 may be designed to include a number of boost level detectors having the same number as that of the detecting levels of the boost voltage desired to detect, and the respective boost level detectors commonly receive the boost voltage Vpp to generate the respective boost-level detecting signals corresponding to the respective boost voltage Vpp, in response to the detecting signals/$\phi$Di from the power supply voltage level detector 10. Even though a specific embodiment of the boost voltage detector 21 is not illustrated, the power supply voltage level detector shown in FIG. 2 may be easily used with a slight modification. In this case, the detecting signals $\phi Di$ from the power supply voltage level detector 10 should be applied as enable signals to the respective boost level detectors included in the boost voltage detector 21.

The boosting circuit of FIG. 1 shows an embodiment of the present invention. However, it is well-known to an ordinary skilled in the art that the circuit shown in FIG. 1 may be modified to be applied to a substrate voltage generator. In more detail, if the power supply voltage Vcc is lowered, the operation of the substrate voltage generator for generating a negative substrate voltage is affected. In order to obtain a stable substrate voltage, a pumping circuit for controlling the level of the substrate voltage at an output node must be stably operated. For this operation, the period of the oscillation pulse from an oscillator which provides a pumping signal to the pumping circuit or pump capacitors of the pumping circuit should be changed adaptively according to the level of the power supply voltage, so as to maintain the substrate voltage at a predetermined level. Therefore, according to the inherent spirit of the present invention, the substrate voltage generator can be constructed in such a manner that in FIG. 1, the pumping circuit 17 pumps the potential at the output node to the negative substrate voltage, and the level of the negative substrate voltage is detected by means of a boost voltage detector 21. Accordingly, the embodiment of the boosting circuit shown in FIG. 1 may be applied to the substrate voltage generator. Namely, the substrate voltage generator is designed in such a manner that, when the power supply voltage Vcc becomes low, the detecting signal/$\phi Di$ is generated by the power supply voltage level detector to increase the frequency of the frequency-controlled oscillation pulse, to change the pumping capacitances of the pump capacitors, and to make the negative substrate voltage maintain the predetermined level, which results in the generation of a stable negative substrate voltage. A detailed circuit of the substrate voltage generator has not been illustrated, but an ordinary skilled in the art can easily achieve the circuit when referring to the construction shown in FIGS. 1 through 5.

As another embodiment in conformity with the technical spirit of the present invention, a semiconductor memory device having a refresh control circuit whose refresh period is adjusted in accordance with a power supply voltage level may be provided.

In most DRAM devices, a self-refresh operation which automatically performs a refresh in a stand-by mode is adopted, and the period between the self-refresh operations is properly set during its manufacturing process. For this reason, the refresh period becomes different when an encapsulated memory device is used in a different power supply voltage. More specifically, since the charges Q stored in a storage capacitor of a memory device is determined by the multiplication of a storage capacitance C of the capacitor and a supplied voltage V (i.e., Q=CV), the refresh time is under a direct influence of the level of the power supply voltage. For example, if a low power supply voltage (e.g., 1.5V) is undesirably applied to a memory device whose refresh period is set to be suited for a power supply voltage of a high power supply voltage (e.g., 3V) in its manufacturing process, the refresh period by a refresh circuit becomes unexpectedly shorter than a preferable data refresh period. Therefore, the data refresh cannot be sufficiently performed, thereby failing to retain the data. On the contrary, if the refresh period is set to be suited for the low power supply voltage (e.g., 1.5V) in the manufacturing process, the refresh period by the refresh circuit becomes unnecessarily shorter than the preferable refresh period when the high power supply voltage (i.e., 3V) is applied, which is inefficient due to the overly frequent refresh operations.

A refresh scheme according to the present invention detects the power supply voltage levels to generate the detecting signals each corresponding to the levels, varies the frequency of the oscillation pulse in response to the detecting signals, and controls the refresh period optimally according to the frequency-varied oscillation pulse. In this case, the power supply voltage level detector 10 and oscillator 12 of FIG. 1 can be used for the same purpose. Thus, the inventive memory device removes the problems of the conventional apparatus and optimally controls the fresh period.

As described above, the present invention generates detecting signals indicating the level of the power supply voltage, varies the frequency of the oscillation pulse in response to the detecting signals, generates a pumping signal for controlling the pumping signal paths to control the pumping capacitances in dependence upon the detecting signals and the pumping signal, and boosts the power supply voltage up to a predetermined level in response to the pumping capacitance control. Further, the inventive circuit detects the boost voltage output to generate a boost-level detecting signal and enables/disables generation of the oscillation pulse in response to the boost-level detecting signal, thereby to stabilize the boost voltage output. In addition, the boost voltage output is not fixed to a constant value but is adaptively variable according to the level of the power supply voltage. Furthermore, a boosting factor (or boosting ratio) is adaptively changeable according to the level of the power supply voltage. For example, the boosting ratio becomes higher for a low power supply voltage, while the boosting ratio becomes lower for a high power supply voltage, thereby capable of providing a semiconductor memory device with a proper, stable boost voltage for driving the word lines and other peripheral circuits.

While the present invention has been particularly shown and described with reference to particular embodiments thereof, it will be understood by those skilled in the art that various changes in form and details may be effected therein without departing from the spirit and scope of the invention as defined by the appended claims.

What is claimed is:
1. A semiconductor memory device, comprising:
power supply voltage level detecting means for detecting a plurality of predetermined levels of a power supply voltage and for generating level detection signals corresponding to respective ones of said predetermined levels; and
oscillating means for generating a frequency-controlled oscillation pulse having a frequency selected in accordance with said level detection signals, said oscillating means including a reference oscillator for generating a reference oscillation pulse having a frequency, and frequency controlling means responsive to said level detection signals for varying said frequency of said reference oscilla- tion pulse to thereby generate said frequency-controlled oscillation pulse.

2. A semiconductor memory device as claimed in claim 1, wherein said frequency controlling means comprises:
counting means including a plurality of serially-connected counters for dividing said reference oscillation pulse and thereby generating frequency-divided pulses;
first NAND gate means receiving said level detection signals and said frequency-divided pulses, wherein a respective one Of said frequency-divided pulses having a higher frequency is logically NANDed with a respective one of said level detection signals corresponding to a lower level of said power supply voltage, and a frequency-divided pulse having a lower frequency is logically NANDed with a respective one of said level detection signals corresponding to a higher level of said power supply voltage;
second NAND gate means for receiving outputs of said first NAND gate means and generating said frequency-controlled oscillation pulse; and,
whereby said frequency of said frequency-controlled oscillation pulse varies according to said level detection signals.

3. A semiconductor memory device, comprising:
power supply voltage level detecting means for detecting a plurality of predetermined levels Of a power supply voltage and for generating level detection signals corresponding to respective ones of said predetermined levels;
oscillating means for generating a frequency-controlled oscillation pulse having a frequency varied in accordance with said level detection signals;
pumping means for pumping up said power supply voltage to generate a boost voltage having a predetermined level by operating pump capacitor means in response to said frequency-controlled oscillation pulse, said pumping means having a pumping ratio which is varied in accordance with said predetermined levels of said power Supply voltage; and,
wherein said oscillating means includes a reference oscillator for generating a reference oscillation pulse having a frequency and frequency controlling means responsive to said level detection signals for varying said frequency of said reference oscillation pulse to thereby generate said frequency-controlled oscillation pulse.

4. A semiconductor memory device as claimed in claim 3, wherein said frequency controlling means comprises:
counting means including a plurality of serially-connected counters for dividing said reference oscillation pulse and thereby generating frequency-divided pulses;
first NAND gate means receiving said level detection signals and said frequency-divided pulses, wherein a respective one of said frequency-divided pulses having a higher frequency is logically NANDed with a respective one of said level detection signals corresponding to a lower level of said power supply voltage, and a frequency-divided pulse having a lower frequency is logically NANDed with a respective one of said level detection signals corresponding to a higher level of said power supply voltage;
second NAND gate means for receiving outputs of said first NAND gate means and generating said frequency-controlled oscillation pulse; and,
whereby said frequency of said frequency-controlled oscillation pulse varies according to said level detection signals.

5. A semiconductor memory device having a boosting circuit comprising:
power supply voltage level detecting means for detecting predetermined levels of a power supply voltage to generate detecting signals each corresponding to said levels;
reference oscillating means for generating a reference oscillation pulse;
pumping driver means for generating a pumping signal in response to the reference oscillation pulse;
pumping means for selectively allowing a plurality of pump capacitors to operate in response to the pumping signal, so as to generate a boost voltage; and
pumping capacitance controlling means for controlling operation of said pump capacitors according to the detecting signals, thereby adjusting a boosting ratio according to the levels of the power supply voltage.

6. A semiconductor memory device as claimed in claim 5, wherein said pumping capacitance controlling means comprises:
controlling means receiving said pumping signal, for controlling pumping signal paths to selectively supply said pumping signal to said pump capacitors, in response to said detecting signals, whereby capacitances of said pump capacitors are controllable in accordance with said detecting signals.

7. A semiconductor memory device as claimed in claim 5 or 6, wherein the capacitances of said pump capacitors are different from each other; wherein the capacitance of a pump capacitor corresponding to a lower level of the power supply voltage is higher than the capacitance of a pump capacitor corresponding to a higher level of the power supply voltage.

8. A semiconductor memory device having a boosting circuit, comprising:
power supply voltage level detecting means for detecting predetermined levels of a power supply voltage and for generating level detection signals corresponding to respective ones of said predetermined levels;
oscillating means for generating a frequency-controlled oscillation pulse having a frequency which is varied in response to said level detection signals;
pumping driver means for generating a pumping signal in response to said frequency-controlled oscillation pulse;
pumping means for selectively enabling one or more of a plurality of pump capacitors to operate in response to said pumping signal and thereby generate a boost voltage;
pumping capacitance controlling means for adjusting a boosting ratio of said pump capacitors in response to Said level detection signals;
boost voltage detecting means for detecting a level of said boost voltage and for generating a boost-level detection signal, and for controlling an oscillating operation of said oscillating means in response to said boost-level detection signal; and,
whereby said frequency of said frequency-controlled oscillation pulse and a pumping capacitance of said pump capacitors are varied in accordance with said power supply voltage.

9. A semiconductor memory device as claimed in claim 8, wherein said oscillating means comprises:

a reference oscillator for generating a reference oscillation pulse in response to said boost-level detection signal; and, frequency controlling means receiving said reference oscillation pulse, and responsive to said level detection signals for generating said frequency-controlled oscillation pulse.

10. A semiconductor memory device as claimed in claim 9, wherein said frequency controlling means comprises:

counting means including a plurality of serially-connected counters for dividing said reference oscillation pulse and thereby generating frequency-divided pulses;

first NAND gate means receiving said level detection signals and said frequency-divided pulses, wherein a respective one of said frequency-divided pulses having a higher frequency is logically NANDed with a respective one of said level detection signals corresponding to a lower level of said power supply voltage, and a frequency-divided pulse having a lower frequency is logically NANDed with a respective one of said level detection signals corresponding to a higher level of said power supply voltage;

second NAND gate means for receiving outputs of said first NAND gate means and generating said frequency-controlled oscillation pulse; and, whereby said frequency of said frequency-controlled oscillation pulse varies according to said level detection signals.

11. A semiconductor memory device as claimed in any one of claims 8–10, wherein said pumping capacitance controlling means comprises:

controlling means receiving said pumping signal, for controlling pumping signal paths to selectively supply said pumping signal to said pump capacitors, in response to said level detection signals, whereby capacitances of said pump capacitors are controllable in accordance with said level detection signals.

12. A semiconductor memory device having a substrate voltage generating circuit, comprising:

power supply voltage level detecting means for detecting predetermined levels of a power supply voltage and for generating level detection signals corresponding to respective ones of said predetermined levels;

oscillating means for generating a frequency-controlled oscillation pulse having a frequency varied in accordance with said level detection signals;

pumping driver means for generating a pumping signal in response to said frequency-controlled oscillation pulse;

pumping means for selectively enabling one or more of a plurality of pump capacitors to operate in response to said pumping signal and thereby generate a substrate voltage;

substrate voltage detecting means for detecting a level of said substrate voltage and for generating a substrate voltage level detection signal, and for controlling an oscillating operation of said oscillating means in response to said substrate voltage level detection signal; and, whereby said frequency of said frequency-controlled oscillation pulse and pumping capacitances of said pump capacitors are varied in accordance with said power supply voltage.

13. A semiconductor memory device as claimed in claim 12, wherein said oscillating means comprises:

a reference oscillator for generating a reference oscillation pulse in response to said substrate voltage level detection signal; and, frequency controlling means receiving said reference oscillation pulse, and responsive to said level detection signals for generating said frequency-controlled oscillation pulse.

14. A semiconductor memory device as claimed in claim 13, wherein said frequency controlling means comprises:

counting means including a plurality of serially-connected counters for dividing said reference oscillation pulse and thereby generating frequency-divided pulses;

first NAND gate means receiving said level detection signals and said frequency-divided pulses, wherein are spective one of said frequency-divided pulses having a higher frequency is logically NANDed with a respective one of said level detection signals corresponding to a lower level of said power supply voltage, and a frequency-divided pulse having a lower frequency is logically NANDed with a respective one of said level detection signals corresponding to a higher level of said power supply voltage;

second NAND gate means for receiving outputs of said first NAND gate means and generating said frequency-controlled oscillation pulse; and, whereby said frequency of said frequency-controlled oscillation pulse varies according to said level detection signals.

15. A semiconductor memory device having a substrate voltage generating circuit, comprising:

power supply voltage level detecting means for detecting predetermined levels of a power supply voltage and for generating level detection signals corresponding to respective ones of said predetermined levels;

reference oscillating means for generating a reference oscillation pulse;

pumping driver means for generating a pumping signal in response to said reference oscillation pulse;

pumping means for selectively enabling one or more of a plurality of pump capacitors to operate in response to said pumping signal and thereby generate a substrate voltage;

pumping capacitance controlling means for adjusting a boosting ratio of said pump capacitors in response to said level detection signals;

substrate voltage detecting means for detecting a level of said substrate voltage and for generating a substrate voltage level detection signal, and for controlling an oscillating operation of said reference oscillating means in response to said substrate voltage level detection signal; and, whereby said reference oscillation pulse has a frequency and said dump capacitors have pumping capacitances which are changeable in accordance with said power supply voltage.

16. A semiconductor memory device as claimed in claim 15, wherein said pumping capacitance controlling means comprises:

controlling means receiving said pumping signal, for controlling pumping signal paths to selectively supply, said pumping signal to said pump capacitors, in response to said level detection signals, whereby said pumping capacitances of said pump capacitors are controllable in accordance with said level detection signals.

17. A semiconductor memory device as claimed in claim 15 or 16, wherein a respective one of said level detection signals corresponding to a lower level of said power supply voltage is provided to a respective one of said pump capacitors having a higher capacitance, and a respective one of said level detection signals corresponding to a higher level of said power supply voltage is provided to a respective one of said pump capacitors having a lower capacitance.

18. A semiconductor memory device having a substrate voltage generating circuit, comprising:

power supply voltage level detecting means for detecting predetermined levels of a power supply voltage and for generating level detection signals corresponding to respective ones of said predetermined levels;

oscillating means for generating a frequency-controlled oscillation pulse having a frequency varied in accordance with said level detection signals;

pumping driver means for generating a pumping signal in response to said frequency-controlled oscillation pulse;

pumping means for selectively enabling one or more of a plurality of pump capacitors to operate in response to said pumping signal and thereby generate a substrate voltage;

pumping capacitance controlling means for adjusting a boosting ratio of said pump capacitors in response to said level detection signals;

substrate voltage detecting means for detecting a level of said substrate voltage and for generating a substrate voltage level detection signal, and for controlling an oscillating operation of said oscillating means in response to said substrate voltage level detection signal; and, whereby said frequency of said frequency-controlled oscillation pulse and pumping capacitances of said pump capacitors are varied in accordance with said power supply voltage.

19. A semiconductor device as claimed in claim 18, wherein said oscillating means comprises:

a reference oscillator for generating a reference oscillation pulse in response to said substrate voltage level detection signal; and, frequency controlling means receiving said reference oscillation pulse, and responsive to said level detection signals for generating said frequency-controlled oscillation pulse.

20. A semiconductor device as claimed in claim 19, wherein said frequency controlling means comprises:

counting means including a plurality of serially-connected counters for dividing said reference oscillation pulse and thereby generating frequency-divided pulses;

first NAND gate means receiving said level detection signals and said frequency-divided pulses, wherein a respective one of said frequency-divided pulses having a higher frequency is logically NANDed with a respective one of said level detection signals corresponding to a lower level of said power supply voltage, and a frequency-divided pulse having a lower frequency is logically NANDed with a respective one of said level detection signals corresponding to a higher level of said power supply voltage;

second NAND gate means for receiving outputs of said first NAND gate means and generating said frequency-controlled oscillation pulse; and, whereby said frequency of said frequency-controlled oscillation pulse varies according to said level detection signals.

21. A semiconductor memory device as claimed in any one of claims 18 to 20, wherein said pumping capacitance controlling means comprises:

controlling means receiving said pumping signal, for controlling pumping signal paths to selectively supply said pumping signal to said pump capacitors, in response to said level detection signals whereby capacitances of said pump capacitors are controllable in accordance with said level detection signals.

* * * * *